(12) United States Patent
Usami

(10) Patent No.: US 9,723,688 B2
(45) Date of Patent: Aug. 1, 2017

(54) LIGHT-EMITTING DEVICE AND MANUFACTURING METHOD THEREFOR

(71) Applicant: FUJIFILM Corporation, Tokyo (JP)

(72) Inventor: Yoshihisa Usami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 64 days.

(21) Appl. No.: 14/993,263

(22) Filed: Jan. 12, 2016

(65) Prior Publication Data

US 2016/0128159 A1    May 5, 2016

Related U.S. Application Data

(63) Continuation of application No. PCT/JP2014/065481, filed on Jun. 11, 2014.

(30) Foreign Application Priority Data

Aug. 2, 2013   (JP) ................................ 2013-161728

(51) Int. Cl.
| | | |
|---|---|---|
| H01J 1/62 | (2006.01) | |
| H05B 33/26 | (2006.01) | |
| B32B 17/10 | (2006.01) | |
| H01L 25/04 | (2014.01) | |
| H05B 33/04 | (2006.01) | |
| H05B 33/10 | (2006.01) | |
| H05B 33/14 | (2006.01) | |
| H01L 27/32 | (2006.01) | |

(52) U.S. Cl.
CPC ....... *H05B 33/26* (2013.01); *B32B 17/10036* (2013.01); *B32B 17/10174* (2013.01); *B32B 17/10541* (2013.01); *B32B 17/10614* (2013.01); *H01L 25/048* (2013.01); *H05B 33/04* (2013.01); *H05B 33/10* (2013.01); *H05B 33/14* (2013.01); *H01L 27/3241* (2013.01); *H01L 27/3288* (2013.01); *H01L 2224/16* (2013.01); *H01L 2924/0002* (2013.01)

(58) Field of Classification Search
CPC ......................... H05B 33/10; H05B 17/10174
USPC ......................... 313/504, 506, 512
See application file for complete search history.

(56) References Cited

U.S. PATENT DOCUMENTS

2012/0164796 A1    6/2012   Lowenthal et al.

FOREIGN PATENT DOCUMENTS

JP    2009-010204 A    1/2009

OTHER PUBLICATIONS

International Search Report; PCT/JP2014/065481; Aug. 19, 2014.
Notification of Transmittal of Translation of the International Preliminary Report on Patentability and Translation of Written Opinion of the International Searching Authority; PCT/JP2014/065481 issued on Feb. 11, 2016.

*Primary Examiner* — Vip Patel
(74) *Attorney, Agent, or Firm* — Studebaker & Brackett PC

(57) ABSTRACT

Provided is a light-emitting device including a pair of substrates each of which includes a conductive layer, a light-emitting element, disposed between the pair of substrates, which includes a first electrode and a second electrode facing each other, and a resin layer, containing conductive particles, which fills a space between the substrates and electrically connects the conductive layers of the substrates to the first and second electrodes of the light-emitting element.

18 Claims, 5 Drawing Sheets

LIGHT-EMITTING DEVICE AND MANUFACTURING METHOD THEREFOR

CROSS-REFERENCE TO RELATED APPLICATIONS

This application is a Continuation of PCT International Application No. PCT/JP2014/065481 filed on Jun. 11, 2014, which claims priority under 35 U.S.C. §119(a) to Japanese Patent Application No. 2013-161728 filed on Aug. 2, 2013. The above application is hereby expressly incorporated by reference, in its entirety, into the present application.

BACKGROUND OF THE INVENTION

1. Field of the Invention

The present invention relates to a light-emitting device in which an inorganic light-emitting element, an organic light-emitting element, or the like is used as a light-emitting element, and a method of manufacturing the light-emitting device, and more particularly, to a light-emitting device having a simple configuration and a method of manufacturing the light-emitting device which facilitates the manufacture of the light-emitting device.

2. Description of the Related Art

At present, backlight units of thin displays, planar illumination devices, and the like are required to be made thin. Light-emitting devices using an LED chip have been proposed.

In light-emitting devices using an LED chip of the related art, an electrode is attached to the LED chip by die bonding with the electrode facing upward, and the electrode of the LED chip and a wiring of a substrate are connected to each other by wire bonding, thereby mounting the LED chip on the substrate. In addition, an LED chip is mounted on a substrate using a flip chip method in which an electrode of the LED chip is placed on the lower side of the LED chip, and the lower electrode and a wiring of the substrate are connected to each other using a conductive material. In this case, it is necessary to adjust the positions of the LED chip and the wiring of the substrate.

Consequently, a method of mounting an LED chip without positioning the LED chip has been proposed (for example, see JP2009-10204A and US2012/0164796A).

In the light-emitting device disclosed in JP2009-10204A, an upper electrode and a lower electrode of an LED chip are connected to a conductive layer of a conductive sheet using an anisotropic conductive resin, and the vicinity of the LED chip is filled with a non-conductive adhesive containing insulating beads.

US2012/0164796A discloses an illumination device using a diode (for example, see FIGS. 1 to 3) having a substantially hexagonal pillar shape (for example, see FIGS. 76 to 79). The patent document discloses that a diode having a width of approximately 10 µm to 50 µm and a height of approximately 5 µm to 25 µm is used as the diode.

US2012/0164796A discloses that diode ink having diodes dispersed in a solvent is applied using a coating method, and the diodes are provided in a conductive layer. Further, the patent document discloses that the diode ink can be printed on, for example, an LED-based illumination device or other flexible sheets. Meanwhile, the diode ink contains a plurality of particles which are substantially chemically inert.

SUMMARY OF THE INVENTION

In the above-described light-emitting device disclosed in JP2009-10204A, an LED chip is connected using an anisotropic conductive resin, and the vicinity of the LED chip is filled with a non-conductive adhesive including insulating beads, and thus there is a problem in that the anisotropic conductive resin and the non-conductive adhesive are required. In addition, in manufacturing the light-emitting device disclosed in JP2009-10204A, it is necessary to attach the anisotropic conductive resin to the LED chip and to provide the non-conductive adhesive in the vicinity of the LED chip, and thus there is a problem in that a manufacturing process becomes complicated.

In addition, in US2012/0164796A described above, it is necessary to process a diode into a special shape such as a substantially hexagonal pillar shape, and thus there is a problem in that a manufacturing cost is increased.

An object of the present invention is to solve such problems of the related art and to provide a light-emitting device having a simple configuration and a method of manufacturing the light-emitting device which facilitates the manufacture of the light-emitting device.

In order to accomplish the above-described object, the present invention provides a light-emitting device including a pair of substrates each of which includes a conductive layer, a light-emitting element, disposed between the pair of substrates, which includes a first electrode and a second electrode facing each other, and a resin layer, containing conductive particles, which fills a space between the substrates and electrically connects the conductive layers of the substrates to the first and second electrodes of the light-emitting element.

It is preferable that the light-emitting device further includes a power supply unit that applies a direct-current voltage or an alternating-current voltage to the first and second electrodes through the conductive layers.

It is preferable that a region between the conductive layer of each of the substrates and each of the first and second electrodes of the light-emitting element has a density higher than that of a region between the substrates.

In addition, it is preferable that, when a distance between the substrates is set to be K (µm), a particle diameter of the conductive particles is set to be a (µm), and a distance between the first electrode or the second electrode of the light-emitting element and the conductive layer of the substrate is set to be m (µm), a relation of m≤a<K is satisfied. It is preferable that, when a thickness is set to be T (µm) and a width is set to be Y (µm) in the light-emitting element, a relation of T×1.5≤Y is satisfied.

The conductive layer of the substrate may be formed in a striped pattern, and the substrates may be disposed so that the conductive layers constitute a lattice. The light-emitting element is, for example, an inorganic light-emitting element or an organic light-emitting element.

In addition, the present invention provides a method of manufacturing a light-emitting device, the method including a step of applying a coating liquid, in which light-emitting elements each including first and second electrodes facing each other and conductive particles are dispersed in a binder, onto a second substrate having a conductive layer formed thereon, to thereby form a coating layer, a step of laminating a first substrate having a conductive layer formed thereon on the second substrate so that the coating layer is interposed between the first and second substrates, and a step of applying pressure in a lamination direction in which the first and second substrates are laminated on each other, and holding the first and second substrates at a preset temperature for a preset period of time in a state where the pressure is applied.

It is preferable that the light-emitting element is an inorganic light-emitting element or an organic light-emitting element.

According to the present invention, it is possible to obtain a light-emitting device having a simple configuration.

Further, according to a manufacturing method of the present invention, it is possible to easily manufacture a light-emitting device.

DESCRIPTION OF THE PREFERRED EMBODIMENTS

Hereinafter, a light-emitting device of the present invention and a method of manufacturing the light-emitting device will be described in detail on the basis of a preferred embodiment shown in the accompanying drawings.

Figure 1A:
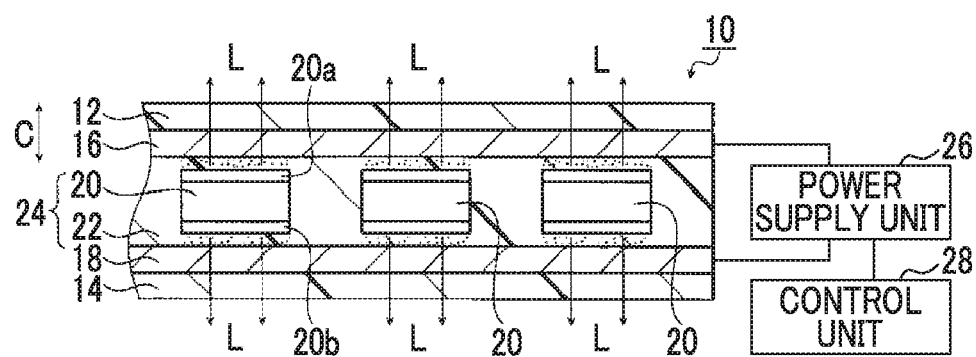
FIG. 1A is a cross-sectional view illustrating a light-emitting device according to an embodiment of the present invention.
Figure 1B:
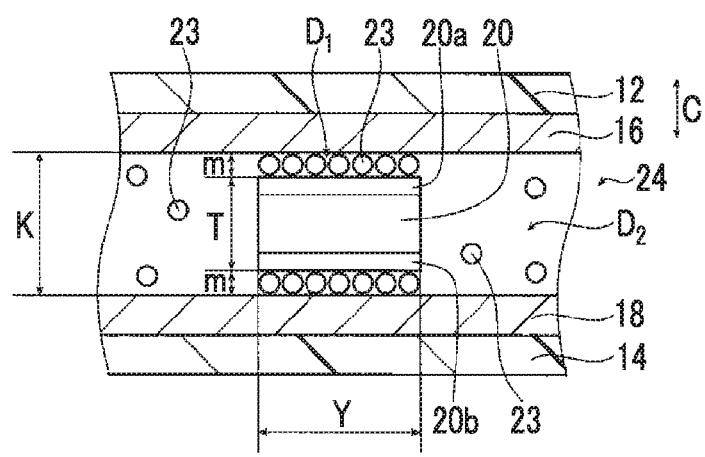
FIG. 1B is an enlarged view of a main portion of the light-emitting device illustrated in FIG. 1A.

FIG. 1A is a cross-sectional view illustrating a light-emitting device according to an embodiment of the present invention, and FIG. 1B is an enlarged view of a main portion of the light-emitting device illustrated in FIG. 1A.

A light-emitting device 10 illustrated in FIG. 1A includes a pair of substrates of a first substrate 12 having a conductive layer 16 formed thereon and a second substrate 14 having a conductive layer 18 formed thereon. For example, the conductive layer 16 is formed on the entire surface of the first substrate 12, and the conductive layer 18 is formed on the entire surface of the second substrate 14.

It is preferable that both the first substrate 12 and the second substrate 14 are transparent, but at least one of the substrates may be opaque.

Here, the term "transparent" as used herein means that an average transmittance in an emission wavelength range is preferably equal to or higher than 50%, is further preferably equal to or higher than 80%, and is most preferably equal to or higher than 90% as a transmittance. The phrase "emission wavelength range" as used herein refers to a range in which the amount of light has a peak intensity of equal to or higher than 10%. Meanwhile, even when the term "transparent" is not particularly mentioned below, the term "transparent" has a meaning specified above. The term "opaque" as used herein has a meaning that does not satisfy the above-described specification of the term "transparent".

The first substrate 12 and the second substrate 14 are disposed in a lamination direction C with a preset interval therebetween. One or a plurality of light-emitting elements 20 are disposed between the first substrate 12 and the second substrate 14, and a space between the first substrate 12 and the second substrate 14 is filled with a resin layer 22.

The light-emitting element 20 includes an upper electrode 20a and a lower electrode 20b which face each other, and light is emitted from both sides of the upper electrode 20a side and the lower electrode 20b side. Polarities of the upper electrode 20a and the lower electrode 20b are not particularly limited insofar as one of the electrodes is a positive electrode and the other is a negative electrode. The upper electrode 20a and the lower electrode 20b may be transparent or opaque. In the case of being opaque, light is emitted from the lateral side of the light-emitting element 20. The light-emitting element 20 is constituted by, for example, an LED chip, an inorganic EL chip, or an organic EL chip.

Meanwhile, the upper electrode 20a is equivalent to a first electrode of the present invention, and the lower electrode 20b is equivalent to a second electrode of the present invention.

The resin layer 22 is formed of, for example, an insulating resin containing conductive particles. For example, an anisotropic adhesive material is used for the resin layer 22.

The upper electrode 20a of the light-emitting element 20 and the conductive layer 16 on the first substrate 12 are electrically connected to each other by the resin layer 22 containing conductive particles, and the lower electrode 20b of the light-emitting element 20 and the conductive layer 18 on the second substrate 14 are electrically connected to each other by the resin layer 22 containing conductive particles. An insulating property is secured in the other regions between the substrates. Hereinafter, the resin layer 22 provided with the light-emitting element 20 is referred to as a light-emitting layer 24.

A power supply unit 26 is connected to the conductive layers 16 and 18, and the power supply unit 26 is connected to a control unit 28.

The power supply unit 26 applies a voltage to the light-emitting element 20 through the conductive layers 16 and 18, and can generate a direct-current voltage or an alternating-current voltage. The power supply unit 26 generates a direct-current voltage or an alternating-current voltage through the control unit 28, and applies the direct-current voltage or the alternating-current voltage to the light-emitting element 20.

Thereby, as illustrated in FIG. 1A, it is possible to emit light beams L from the first substrate 12 and the second substrate 14.

The light-emitting layer 24 is constituted by only the light-emitting elements 20 and the resin layer 22, and has a simple configuration in which there are no other components. In a light-emitting device of the related art, disclosed in, for example, JP2009-10204A (Patent Document 1), in which an upper electrode and a lower electrode of an LED chip are connected to a conductive layer of a conductive sheet using an anisotropic conductive resin, the anisotropic conductive resin (anisotropic conductive film) is present, and thus an interface is larger. On the other hand, in the light-emitting layer 24 that does not use an anisotropic conductive resin, an interface can be smaller than in the above-mentioned light-emitting device of the related art.

The light-emitting layer 24 has high resistance against bending or the like due to the above-mentioned simple configuration, and the occurrence of peeling is also suppressed by a small interface. In this manner, it is possible to obtain a light-emitting layer 24 having high resistance against bending and peeling in the light-emitting device 10.

In the light-emitting device 10, the first substrate 12, the second substrate 14, and the conductive layers 16 and 18 are configured to be flexible, and thus it is possible to configure a light-emitting device 10 which is flexible as a whole.

In the present embodiment, the first substrate 12 and the second substrate 14 can be formed of, for example, triacetyl cellulose (TAC), poly ethylene terephthalate (PET), poly ethylene naphthalate (PEN), syndiotactic polystyrene (SPS), polyphenylene sulfide (PPS), polycarbonate (PC), polyarylate (PAr), polysulfone (PSF), polyester sulfone (PES), polyetherimide (PEI), cyclic polyolefin, polyimide (PI), or the like. In this manner, when a resin is used for the substrate, the substrates can be configured to be flexible as described above. Meanwhile, the first substrate 12 and the second substrate 14 may be formed using a glass substrate.

The conductive layers 16 and 18 are formed of, for example, ITO, ZnO, or a conductor containing Ag nanoparticles or Ag nanowires. It is preferable that both the conductive layers 16 and 18 are transparent. However, both the layers do not necessarily have to be transparent, and at least one of the layers may be opaque.

In addition, the conductive layers 16 and 18 do not cover the entirety of the surfaces of the substrates and are omitted from a portion thereof, so that light may pass therethrough. In addition, when the light-emitting element 20 has a sufficient conductivity, the conductive layers 16 and 18 may not be present.

The resin layer 22 is not particularly limited insofar as the resin layer is formed of an insulating resin, and a thermosetting resin, a thermoplastic resin, a synthetic rubber, and the like can be appropriately used for the resin layer.

Conductive particles 23 are not particularly limited insofar as the conductive particles are particles having conductivity, and various types of conductive particles used for a conductive adhesive and an anisotropic conductive adhesive can be used. For example, it is possible to use Au, Ag, Cu, ZnO, ITO, and Ni coated with Au as the conductive particles. Electrical connection between the light-emitting element 20 and the conductive layers 16 and 18 is secured by the conductive particles 23.

Meanwhile, it is preferable that the resin layer 22 and the conductive particles 23 are transparent.

In addition, as illustrated in FIG. 1B, when a volume density of the conductive particles 23 in a region between the upper electrode 20a or the lower electrode 20b of the light-emitting element 20 and the conductive layer 16 on the first substrate 12 or a region between the upper electrode or the lower electrode of the light-emitting element and the conductive layer 18 on the second substrate 14 is set to be $D_1$ and a volume density of the conductive particles 23 in a region between the light-emitting elements 20 in the resin layer 22 between the substrates is set to be $D_2$, it is preferable that the relation of $D_2<D_1$ is satisfied. Thereby, it is possible to suppress a current flowing between the substrates while supplying a voltage to the light-emitting element 20.

The shape of the light-emitting element 20 is not particularly limited. As illustrated in FIG. 1B, in the light-emitting element 20, when a thickness is set to be T (μm) and a width is set to be Y (μm), it is preferable that the relation of $T\times1.5\leq Y$ is satisfied. In the case of a rectangular parallelepiped shape, a smallest dimension is set to be Y. Since the light-emitting element 20 is configured to have such a shape, there is a tendency for the upper electrode 20a and the lower electrode 20b of the light-emitting element 20 to face the conductive layers 16 and 18 at the time of disposing the light-emitting element 20.

The shape of the light-emitting element 20 may not be a rectangular parallelepiped shape, and may be a hexagonal pillar shape, an octagonal pillar shape, or the like. At this time, regarding a width, the shortest diagonal line is set to be Y.

In addition, as illustrated in FIG. 1B, when a distance between the first substrate 12 and the second substrate 14 is set to be K (μm), a particle diameter of the conductive particles 23 is set to be a (μm), and a distance between the upper electrode 20a or the lower electrode 20b of the light-emitting element 20 and the conductive layer 16 on the first substrate 12 or a distance between the upper electrode or the lower electrode of the light-emitting element and the conductive layer 18 on the second substrate 14 is set to be m (μm), it is preferable that the relation of $m\leq a<K$ is satisfied at least partially. Thereby, it is possible to reliably electrically connect the light-emitting element 20 and the conductive layers 16 and 18.

The distance K between the substrates is approximately 10 μm to 500 μm, the particle diameter a of the conductive particles 23 is approximately 1 μm to 100 μm, and the distance m is approximately 1 μm to 100 μm. The particle diameter of the conductive particles 23 is measured by, for example, a BET method.

The orientation of the light-emitting element 20 with respect to the lamination direction C is not particularly limited. The upper electrode 20a may be connected to the conductive layer 18 on the second substrate 14, and the lower electrode 20b may be connected to the conductive layer 16 on the first substrate 12. It is preferable that the orientations of the plurality of light-emitting elements 20 with respect to the lamination direction C are aligned. However, the orientations are not required to be aligned, and light-emitting elements having different orientations may be jointly present. When light-emitting elements 20 having different orientations with respect to the lamination direction C are jointly present, it is possible to make the light-emitting elements 20 emit light by applying an alternating-current voltage.

Figure 2A:
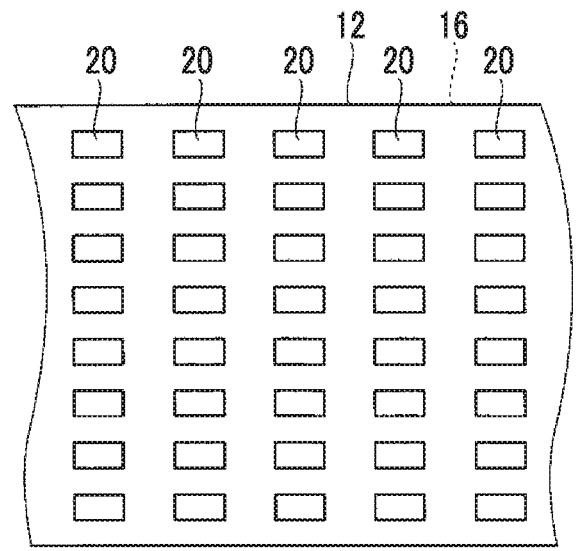
FIG. 2A is a schematic plan view illustrating an arrangement state of light-emitting elements of the light-emitting device illustrated in FIG. 1A.
Figure 2B:
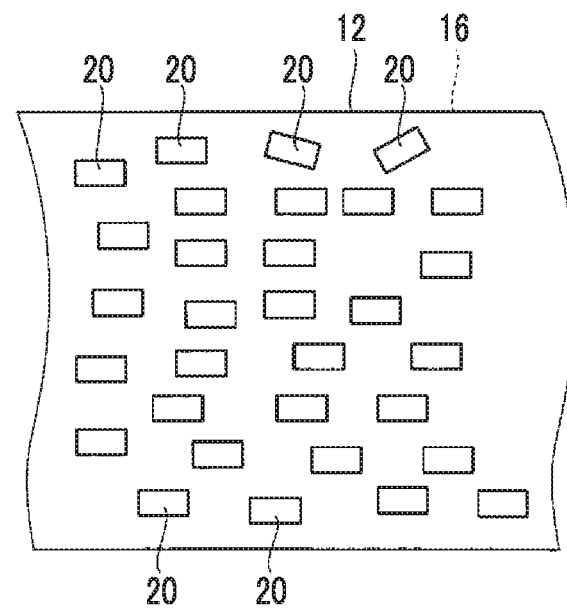
FIG. 2B is a schematic plan view illustrating another example of an arrangement state of light-emitting elements of the light-emitting device illustrated in FIG. 1A.

The arrangement of the light-emitting elements 20 is not particularly limited. For example, it is preferable that the light-emitting elements are regularly arranged as illustrated in FIG. 2A, but the light-emitting elements may be randomly arranged as illustrated in FIG. 2B. Even in this case, the orientations of the light-emitting elements 20 with respect to the lamination direction C may be aligned as described above, or light-emitting elements having different orientations with respect to the lamination direction C may be jointly present.

For example, a ratio of an area of the light-emitting elements 20 to that of the first substrate 12 is, for example, 0.01% to 90%, preferably 0.1% to 50%, and further preferably 1% to 30%.

Figure 3A:
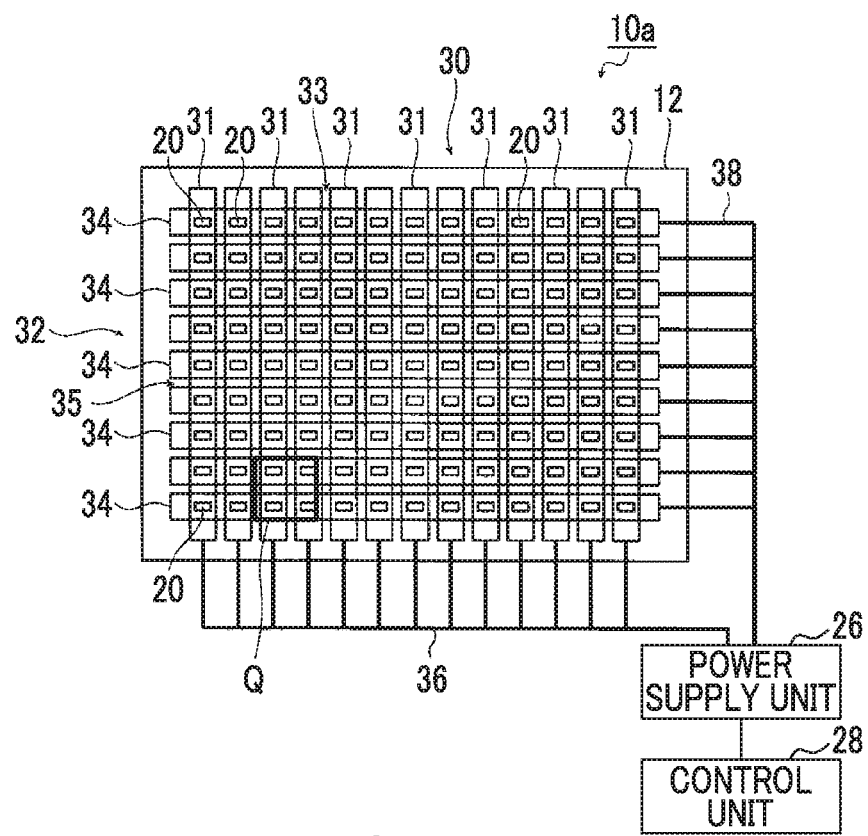
FIG. 3A is a schematic plan view illustrating another example of the light-emitting device according to the embodiment of the present invention.
Figure 3B:
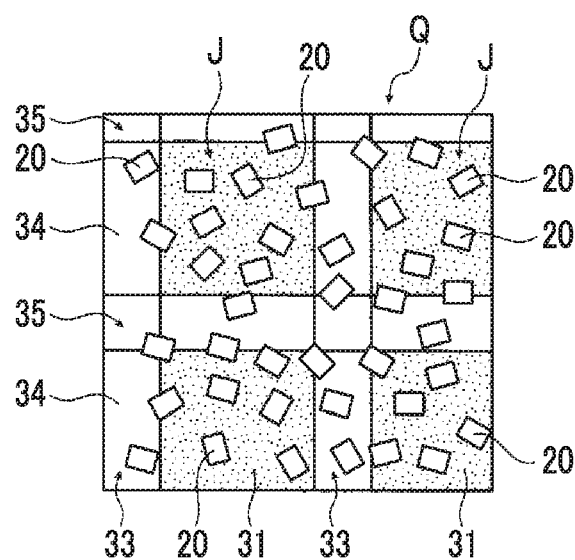
FIG. 3B is an enlarged view of a main portion illustrated in FIG. 3A.

The present invention is not limited to the light-emitting device 10 illustrated in FIG. 1A, and a light-emitting device 10a illustrated in FIGS. 3A and 3B can be configured. FIG. 3B is an enlarged view of a region Q illustrated in FIG. 3A. In the light-emitting device 10a illustrated in FIG. 3A, the same components as those of the light-emitting device 10 illustrated in FIGS. 1A and 1B are denoted by the same reference numerals and signs, and a detailed description thereof will not be repeated.

In the light-emitting device 10a illustrated in FIG. 3A, conductive layers 30 and 32 are formed in a striped pattern, and a first substrate 12 and a second substrate 14 are disposed so as to configure a lattice in which the conductive layer 30 and the conductive layer 32 are perpendicular to each other.

In the conductive layer 30, conductive portions 31 are connected to a power supply unit 26 through a wiring 36. In the conductive layer 32, conductive portions 34 are connected to the power supply unit 26 through a wiring 38.

A voltage is applied to light-emitting elements 20 provided between the conductive portions 31 of the conductive layer 30 and the conductive portions 34 of the conductive layer 32 in a lamination direction C (see FIG. 1A) in which the first substrate 12 and the second substrate 14 are laminated on each other, whereby light is emitted. In the light-emitting device 10a, the light-emitting element 20 located at any position between each of the conductive portions 31 of the conductive layer 30 and each of the conductive portions 34 of the conductive layer 32, that is, at an intersection point between the conductive portion 31 and the conductive portion 34 can be made to emit light using a method which is generally called a matrix driving method.

In the light-emitting device 10a, as illustrated in FIG. 3B, it is preferable that a plurality of light-emitting elements 20 are present at each intersection point J between the conductive portion 31 and the conductive portion 34. In addition, it is preferable that the length of the longest diagonal line of the light-emitting element 20 is smaller than the width between the conductive layers 30 (width of a region 33 between the conductive portions 31) and the width between the conductive layers 32 (width of a region 35 between the conductive portions 34) from the viewpoint of preventing a short circuit.

In the light-emitting device 10a, the arrangement state of the light-emitting elements 20 is not particularly limited insofar as the light-emitting elements are arranged on the conductive layers 30 and 32. The light-emitting elements 20 may be present in the region 33 between the conductive portions 31 of the conductive layer 30 and the region 35 between the conductive portions 34 of the conductive layer 32 in the plane direction of the substrate. In this case, a voltage is not supplied to the light-emitting elements 20 which are not present between the conductive layer 30 and the conductive layer 32 in the lamination direction in which the first substrate 12 and the second substrate 14 are laminated on each other, and thus light is not emitted. However, the arrangement of the light-emitting elements 20 is not limited, and thus it is possible to reduce the accuracy of the positioning of the light-emitting elements 20.

Meanwhile, also in the light-emitting device 10a, even when the orientations of the light-emitting elements 20 with respect to the lamination direction C are aligned, light-emitting elements having different orientations may be jointly present. A direct-current voltage is applied when all of the orientations of the light-emitting elements 20 with respect to the lamination direction C are aligned, and an alternating-current voltage is applied when the light-emitting elements having different orientations are jointly present.

Figure 4A:
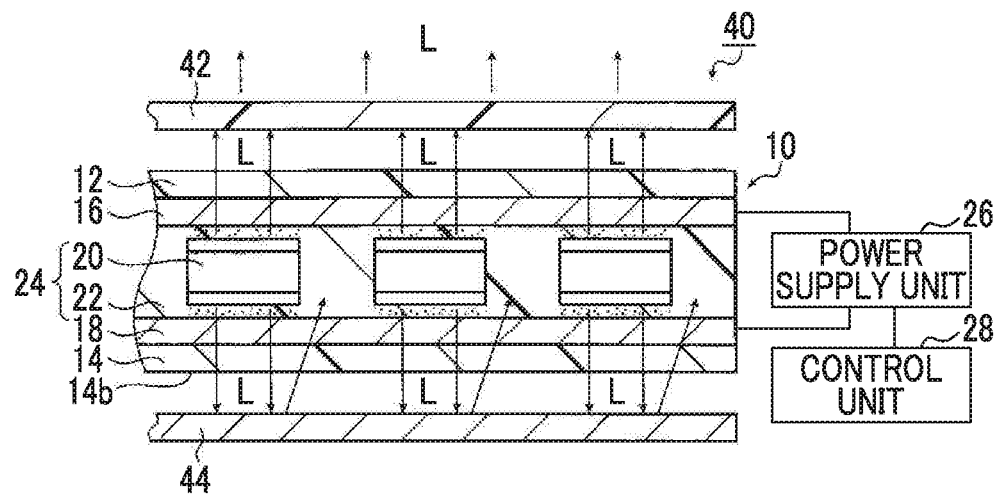
FIG. 4A is a cross-sectional view illustrating an illumination device using the light-emitting device according to the embodiment of the present invention.

The light-emitting devices 10 and 10a described above can be applied to, for example, an illumination device illustrated in FIG. 4A.

In an illumination device 40 illustrated in FIG. 4A, a scattering plate 42 is disposed on the first substrate 12 of the light-emitting device 10, and a reflective plate 44 is disposed below a lower surface 14b of the second substrate 14 of the light-emitting device 10. In the illumination device 40, light-emitting elements 20 are made to emit light, and thus light beams L emitted to the first substrate 12 side pass through the scattering plate 42 and are emitted to the outside, and light beams L emitted to the second substrate 14 side are reflected to the first substrate 12 side by the reflective plate 44 and are emitted to the outside from the scattering plate 42.

A known plate can be appropriately used as the scattering plate 42 and the reflective plate 44. In addition, the scattering plate may also serve as the first substrate 12, and the reflective plate may also serve as the second substrate 14.

Meanwhile, in the illumination device 40, the light-emitting device 10a illustrated in FIGS. 3A and 3B can also be used instead of the light-emitting device 10 illustrated in FIG. 1A. In this case, the light-emitting element 20 located at a specific position can be made to emit light by a matrix driving method. Also when the light-emitting device 10a is used, the scattering plate may also serve as the first substrate 12, and the reflective plate may also serve as the second substrate 14.

Further, when the light-emitting device 10a is used, it is preferable that one of the plurality of light-emitting elements 20 is present at every intersection point J between the conductive portion 31 and the conductive portion 34 as described above (see FIG. 3B). It is also preferable that the length of the longest diagonal line of the light-emitting element 20 is smaller than a width between the conductive layers 30 and a width between the conductive layers 32 from the viewpoint of preventing a short circuit as described above.

In addition, the first substrate 12, the second substrate 14, and conductive layers 16 and 18 of the light-emitting device 10 are configured to be flexible, and thus it is possible to configure the flexible illumination device 40 which is bendable. Also when the light-emitting device 10a is used, the first substrate 12, the second substrate 14, and the conductive layers 30 and 32 are configured to be flexible, and thus it is possible to configure a flexible illumination device 40 which is bendable.

Figure 4B:
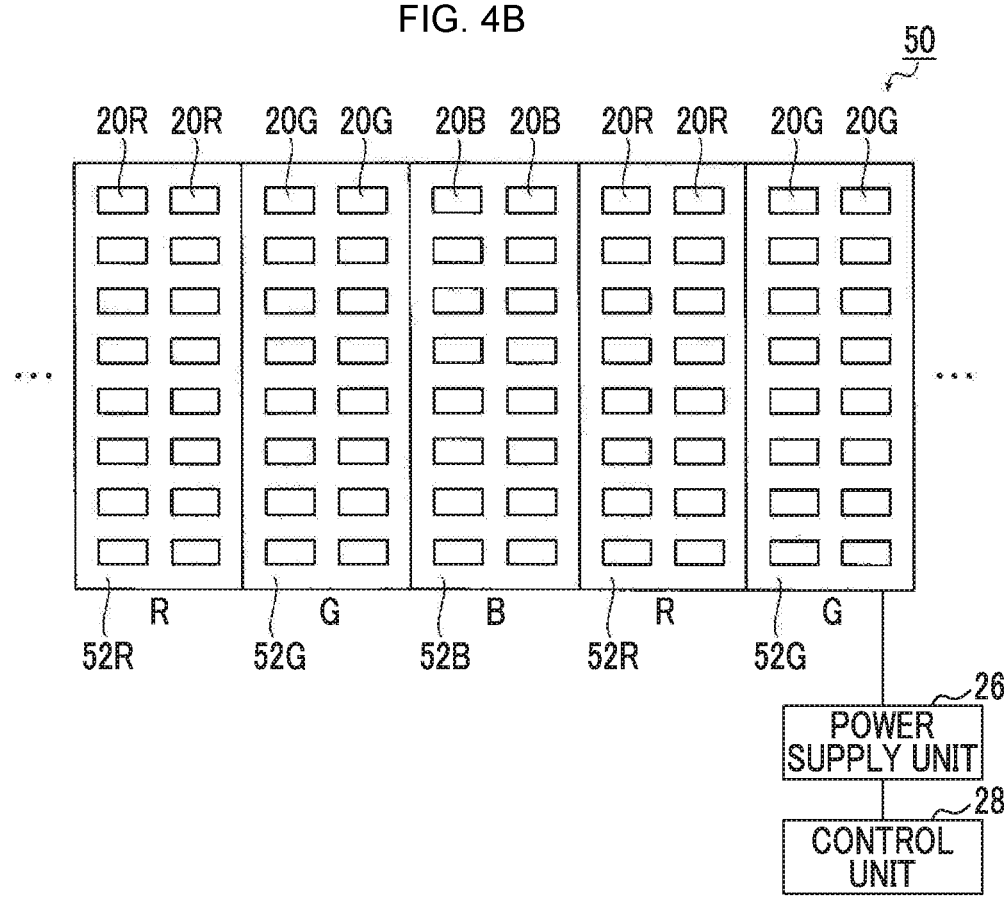
FIG. 4B is a plan view illustrating a display device using the light-emitting device according to the embodiment of the present invention.

In addition, a display device 50 illustrated in FIG. 4B can be configured by using light-emitting elements with three primary colors of red, green, and blue. In this case, a plurality of light-emitting elements 20R emitting red light are disposed to configure a red pixel 52R, a plurality of light-emitting elements 20G emitting green light are disposed to configure a green pixel 52G, and a plurality of light-emitting elements 20B emitting blue light are disposed to configure a blue pixel 52B. The red pixel 52R, the green pixel 52G, and the blue pixel 52B are connected to a power supply unit 26, and a voltage is applied from the power supply unit 26, and thus the light-emitting elements 20R, the light-emitting elements 20G, and the light-emitting elements 20B emit the respective colors of light. The application of the voltage from the power supply unit 26 is controlled by a control unit 28. The control unit 28 displays an image by making the red pixel 52R, the green pixel 52G, and the blue pixel 52B emit light at a preset light emission timing for a preset period of time, for example, in accordance with an object to be displayed. It is preferable that the orientations of the light-emitting elements 20R, the light-emitting elements 20G, and the light-emitting elements 20B are aligned.

Meanwhile, the display device 50 is configured such that the red pixel 52R, the green pixel 52G, and the blue pixel 52B are disposed similar to a known display device, and can display an image using a known driving method.

When a pixel is constituted by one light-emitting element, a pixel cannot be displayed in a case where the light-emitting element becomes defective. On the other hand, the display device 50 can be configured so that a plurality of light-emitting elements constitute one pixel, and thus a defect of a light-emitting element becomes inconspicuous. Further, the brightness of a pixel in which a defect has occurred in a light-emitting element is increased, and thus the pixel may have the same amount of light as those of peripheral pixels. Further, a known control circuit constituted by a TFT element or the like is disposed for each pixel, and thus it is possible to perform control with a higher degree of accuracy.

Next, a method of manufacturing the light-emitting device 10 of the present embodiment will be described.

Figure 5:
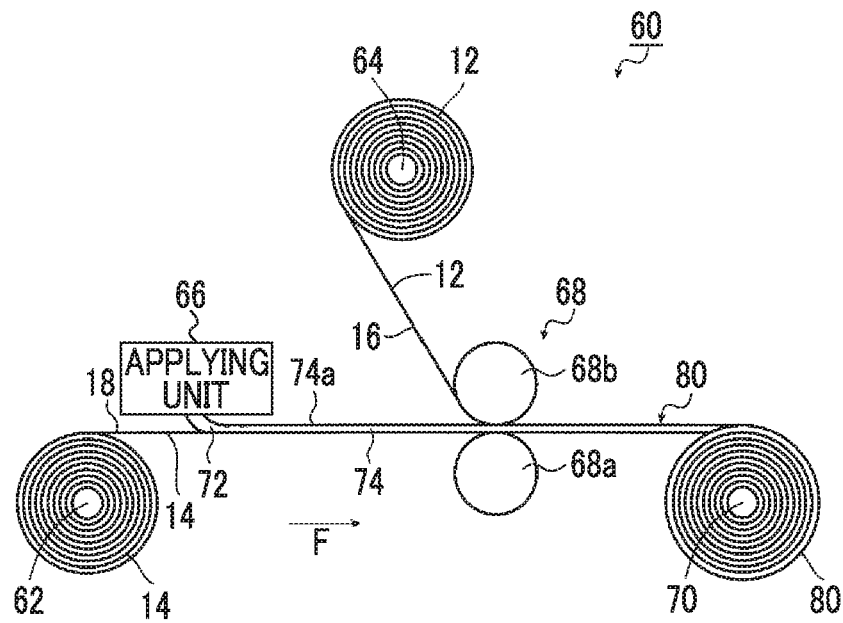
FIG. 5 is a schematic diagram illustrating a manufacturing device used to manufacture the light-emitting device according to the embodiment of the present invention.
Figure 6:
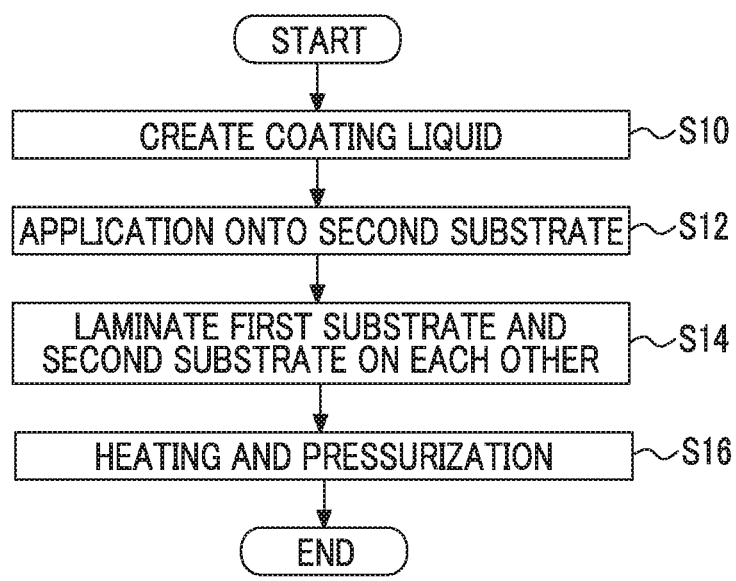
FIG. 6 is a flow chart illustrating a method of manufacturing the light-emitting device according to the embodiment of the present invention.

FIG. 5 is a schematic diagram illustrating a manufacturing device used to manufacture the light-emitting device according to the embodiment of the present invention, and FIG. 6 is a flow chart illustrating a method of manufacturing the light-emitting device according to the embodiment of the present invention.

In manufacturing a light-emitting device, a light-emitting element necessary for the light-emitting device, a first substrate having a conductive layer formed thereon, and a second substrate having a conductive layer formed thereon are prepared. Meanwhile, for example, a PET substrate is used for the first substrate and the second substrate, and the conductive layer is constituted by an ITO film formed by, for example, a sputtering method.

A manufacturing device 60 used to manufacture the light-emitting device illustrated in FIG. 5 is a roll-to-roll type device, and includes a rotating shaft 62 around which the second substrate 14, having the conductive layer 18 formed thereon, is wound in a roll shape, a rotating shaft 64 around which the first substrate 12, having the conductive layer 16 formed thereon, is wound in a roll shape, an applying unit 66, a roller pair 68 that laminates the first substrate 12 on the second substrate 14 and applies pressure and heat thereto, and, a winding shaft 70 around which a laminate 80, having the first substrate 12 and the second substrate 14 laminated on each other and being subjected to heating and pressurization, is wound in a roll shape.

The applying unit 66 applies a coating liquid 72 to be described later onto the conductive layer 18 of the second substrate 14 to thereby form a coated film 74. For example, slit coating, bar coating, or a screen printing method is used to apply the coating liquid 72.

The roller pair 68, including rollers 68a and 68b provided with a heater therein, draws in the first substrate by the roller 68b and performs heating and pressurization for a predetermined period of time at a pressure and a temperature which are set in advance while laminating the first substrate on the second substrate 14 having the coated film 74 formed thereon, thereby obtaining the laminate 80.

In the roller pair 68, power in a transport direction F is applied to the light-emitting element 20 by gradually increasing a pressure of the roller 68b on the roller 68a from the initial stage during the pressurization and heating, so that the upper electrode 20a of the light-emitting element 20 can be made to face the conductive layers 16 and 18.

In addition, power in the transport direction F is applied to the light-emitting element 20 also by gradually increasing a rotation speed of the roller 68b with respect to the roller 68a from the initial stage, so that the upper electrode 20a of the light-emitting element 20 can be made to face the conductive layers 16 and 18. This control can be performed with a higher degree of accuracy by installing a plurality of rollers for pressurization and heating.

Since a certain degree of pressure is applied in a wound state, it is also possible to further increase adhesion by further performing heating.

Further, a method of manufacturing a light-emitting device using a flow chart illustrated in FIG. 6 will be described. First, the plurality of light-emitting elements 20 and conductive particles are put in a binder such as, for example, an insulating adhesive, thereby obtaining a coating liquid for applying the light-emitting elements onto the second substrate (step S10). A viscosity adjusting agent, a solvent, and the like can be appropriately added to the coating liquid. In addition, the applying unit 66 is filled with the coating liquid.

Examples of the insulating adhesive to be used include a thermosetting resin agent, a thermoplastic resin agent, a synthetic rubber, and the like.

Meanwhile, the coating liquid may be obtained by mixing the plurality of light-emitting elements 20 into an anisotropic conductive agent.

In the manufacturing device 60, the second substrate 14 unwound from the rotating shaft 62 is wound around the winding shaft 70 in advance through the roller pair 68. In addition, the coating liquid 72 is applied onto the conductive layer 18 of the second substrate 14 from the applying unit 66 while winding the second substrate 14 around the winding shaft 70 in the transport direction F (step S12), thereby forming the coated film 74. Accordingly, the light-emitting elements 20 are disposed on the conductive layer 18 of the second substrate 14.

Meanwhile, a surface 74a of the coated film 74 may be made even so that the upper electrode 20a of the light-emitting element 20 is made to face the conductive layers 16 and 18.

Next, the first substrate 12 having a roll shape is rewound to be wound around the roller 68b of the roller pair 68, and the first substrate 12 and the second substrate 14 are laminated on each other while transporting the second substrate 14 in the transport direction F (step S14). At this time, the rollers 68a and 68b are set to be at a preset temperature, and are held for a preset period of time at a preset temperature simultaneously with the lamination and perform heating and pressurization (step S16). The heating and pressurization are performed under conditions such as, for example, a temperature of 150° C. and a period of time of 10 seconds.

Accordingly, the upper electrode 20a and the lower electrode 20b are electrically connected to the conductive layers 16 and 18 in accordance with the orientation of the light-emitting element 20 with respect to the lamination direction C (see FIG. 1A), and a resin layer 22 is formed in the vicinity of the light-emitting element 20 between the first substrate 12 and the second substrate 14, thereby obtaining the laminate 80. The laminate 80 is wound around the winding shaft 70 in a roll shape. Thereafter, the laminate 80 is cut off into a preset size, and is connected to the power supply unit 26 and the control unit 28 which are described above, and thus it is possible to obtain the light-emitting device 10 illustrated in FIG. 1A.

Meanwhile, the light-emitting device 10a mentioned above can also be manufactured in the same manner as the light-emitting device 10 except that patterns of the conductive layers 30 and 32 are different. For this reason, a detailed description thereof will not be repeated. In this case, when the conductive layers 30 and 32 are formed in a striped pattern and are laminated on each other by the roller pair 68, the first substrate 12 is attached to the rotating shaft 62 and the second substrate 14 is attached to the rotating shaft 62 so that the conductive layers 30 and 32 constitute a lattice.

A method of manufacturing a light-emitting device is not limited to a roll-to-roll type, and a sheet type can also be used. In this case, in heating and pressurization processes, the first substrate 12 and the second substrate 14 are pressed with a preset pressure with, for example, a pair of flat plates interposed therebetween in a direction in which the first and second substrates are laminated on each other, are heated at a preset temperature, and are held for a preset period of time.

In addition, in the manufacturing method of the present embodiment, a method of creating and applying a coating liquid is used, but the present invention is not limited thereto. An anisotropic conductive adhesive may be applied, the light-emitting elements may be scattered thereon, and an anisotropic conductive adhesive may be applied again so as to cover the light-emitting elements.

Meanwhile, the inventor created a light-emitting device in the following manner, and confirmed light emission.

First, a PET substrate on which an ITO film is formed as a conductive layer was used, and an anisotropic conductive adhesive was applied onto the ITO film using, for example, a brush.

Next, LED chips each having an upper electrode and a lower electrode were scattered on the anisotropic conductive adhesive as light-emitting elements. Further, the anisotropic conductive adhesive was applied using, for example, a brush.

The PET substrate having the ITO film formed thereon was superimposed thereon so that the ITO film faced the anisotropic conductive adhesive.

In addition, each PET substrate was interposed between flat aluminum plates each having a thickness of 3 mm, pressure was applied thereto, and heat treatment was performed at a temperature of 150° C. for 10 minutes, thereby creating a light-emitting device.

Meanwhile, ThreeBond3373 (trade name) was used as the anisotropic conductive adhesive.

When an alternating-current voltage of ±10 V was applied to the LED chips through the ITO film of the light-emitting device, light was emitted. The amount of light emitted was 1.4 times the amount of light emitted when a direct-current voltage of 10 V was applied.

The present invention is basically configured as described above. As described above, the light-emitting device and the method of manufacturing the same of the present invention have been described in detail. However, the present invention is not limited to the above-described embodiment, and various improvements or modifications may of course be made without departing from the scope of the invention.

EXPLANATION OF REFERENCES 10, 10a: LIGHT-EMITTING DEVICE
12: FIRST SUBSTRATE
14: SECOND SUBSTRATE
16, 18, 30, 32: CONDUCTIVE LAYER
20: LIGHT-EMITTING ELEMENT
20a: UPPER ELECTRODE
20b: LOWER ELECTRODE
22: RESIN LAYER
23: CONDUCTIVE PARTICLES
24: LIGHT-EMITTING LAYER
26: POWER SUPPLY UNIT
28: CONTROL UNIT
40: ILLUMINATION DEVICE
42: SCATTERING PLATE
44: REFLECTIVE PLATE
50: DISPLAY DEVICE
60: MANUFACTURING DEVICE
72: COATING LIQUID
74: COATED FILM
80: LAMINATE

What is claimed is:

1. A light-emitting device comprising:
   a pair of substrates each of which includes a conductive layer;
   a light-emitting element, disposed between the pair of substrates, which includes a first electrode and a second electrode facing each other; and
   a resin layer, containing conductive particles, which fills a space between the substrates and electrically connects the conductive layers of the substrates to the first and second electrodes of the light-emitting element.

2. The light-emitting device according to claim 1, further comprising a power supply unit that applies a direct-current voltage or an alternating-current voltage to the first and second electrodes through the conductive layers.

3. The light-emitting device according to claim 1, wherein a region between the conductive layer of each of the substrates and each of the first and second electrodes of the light-emitting element has a density higher than that of a region between the substrates.

4. The light-emitting device according to claim 2, wherein a region between the conductive layer of each of the substrates and each of the first and second electrodes of the light-emitting element has a density higher than that of a region between the substrates.

5. The light-emitting device according to claim 1, wherein when a distance between the substrates is set to be K (μm), a particle diameter of the conductive particles is set to be a (μm), and a distance between the first electrode or the second electrode of the light-emitting element and the conductive layer of the substrate is set to be m (μm), a relation of m≤a<K is satisfied.

6. The light-emitting device according to claim 2, wherein when a distance between the substrates is set to be K (μm), a particle diameter of the conductive particles is set to be a (μm), and a distance between the first electrode or the second electrode of the light-emitting element and the conductive layer of the substrate is set to be m (μm), a relation of m≤a<K is satisfied.

7. The light-emitting device according to claim 3, wherein when a distance between the substrates is set to be K (μm), a particle diameter of the conductive particles is set to be a (μm), and a distance between the first electrode or the second electrode of the light-emitting element and the conductive layer of the substrate is set to be m (μm), a relation of m≤a<K is satisfied.

8. The light-emitting device according to claim 1, wherein when a thickness is set to be T (μm) and a width is set to be Y (μm) in the light-emitting element, a relation of T×1.5≤Y is satisfied.

9. The light-emitting device according to claim 2, wherein when a thickness is set to be T (μm) and a width is set to be Y (μm) in the light-emitting element, a relation of T×1.5≤Y is satisfied.

10. The light-emitting device according to claim 3, wherein when a thickness is set to be T (μm) and a width is set to be Y (μm) in the light-emitting element, a relation of T×1.5≤Y is satisfied.

11. The light-emitting device according to claim 1, wherein the conductive layer of the substrate is formed in a striped pattern, and the substrates are disposed so that the conductive layers constitute a lattice.

12. The light-emitting device according to claim 2, wherein the conductive layer of the substrate is formed in a striped pattern, and the substrates are disposed so that the conductive layers constitute a lattice.

13. The light-emitting device according to claim 3, wherein the conductive layer of the substrate is formed in a striped pattern, and the substrates are disposed so that the conductive layers constitute a lattice.

14. The light-emitting device according to claim 1, wherein the light-emitting element is an inorganic light-emitting element or an organic light-emitting element.

15. The light-emitting device according to claim 2, wherein the light-emitting element is an inorganic light-emitting element or an organic light-emitting element.

16. The light-emitting device according to claim 3, wherein the light-emitting element is an inorganic light-emitting element or an organic light-emitting element.

17. A method of manufacturing a light-emitting device, the method comprising:
- a step of applying a coating liquid, in which light-emitting elements each including first and second electrodes facing each other and conductive particles are dispersed in a binder, onto a second substrate having a conductive layer formed thereon, to thereby form a coating layer;
- a step of laminating a first substrate having a conductive layer formed thereon on the second substrate so that the coating layer is interposed between the first and second substrates; and
- a step of applying pressure in a lamination direction in which the first and second substrates are laminated on each other, and holding the first and second substrates at a preset temperature for a preset period of time in a state where the pressure is applied.

18. The method according to claim 17, wherein the light-emitting element is an inorganic light-emitting element or an organic light-emitting element.

\* \* \* \* \*